(12) United States Patent
Jimarez et al.

(10) Patent No.: US 6,194,667 B1
(45) Date of Patent: *Feb. 27, 2001

(54) RECEPTOR PAD STRUCTURE FOR CHIP CARRIERS

(75) Inventors: Miguel Angel Jimarez, Newark Valley; Reinaldo Anthony Neira, Endicott, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/136,585

(22) Filed: Aug. 19, 1998

(51) Int. Cl.$^7$ .............................. H01R 12/04; H05K 1/11
(52) U.S. Cl. ............................................. 174/261; 361/777
(58) Field of Search ................................. 174/261, 263, 174/260; 361/760, 768, 769, 770, 771, 777; 257/777

(56) References Cited

U.S. PATENT DOCUMENTS

| | | | |
|---|---|---|---|
| 4,336,551 | 6/1982 | Fujita et al. | 357/80 |
| 4,706,167 | * 11/1987 | Sullivan | 361/406 |
| 4,775,573 | * 10/1988 | Turek | 428/209 |
| 5,075,965 | 12/1991 | Carey et al. | 20/840 |
| 5,313,021 | * 5/1994 | Sajja et al. | 174/260 |
| 5,386,087 | * 1/1995 | Lee et al. | 174/261 |
| 5,428,505 | 6/1995 | Sakemi et al. | 361/777 |
| 5,483,421 | * 1/1996 | Gedney et al. | 361/771 |
| 5,523,920 | 6/1996 | Machuga et al. | 361/767 |
| 5,706,178 | 1/1998 | Barrow | 361/777 |
| 5,795,818 | * 8/1998 | Marrs | 438/612 |
| 5,801,446 | * 9/1998 | DiStefano et al. | 257/778 |
| 5,812,379 | * 9/1998 | Barrow | 361/773 |
| 5,818,697 | * 10/1998 | Armezzani et al. | 361/749 |
| 5,825,639 | * 10/1998 | Hoebener et al. | 361/777 |
| 5,977,642 | * 11/1999 | Appelt et al. | 257/780 |
| 6,020,561 | * 2/2000 | Ishida et al. | 174/261 |

* cited by examiner

*Primary Examiner*—Jeffrey Gaffin
*Assistant Examiner*—Jeremy Norris
(74) *Attorney, Agent, or Firm*—Scully, Scott, Murphy & Presser; John R. Pivnichny

(57) ABSTRACT

Receptor pad structures for chip carriers, and in particular, non-floating BLM C-4 receptor pads for organic chip carriers preferably utilizing eutectic solder. On the receptor pads of chip carriers, particularly in providing equal distributions of the solder so that all pad areas are equalized irrespective as the type and size of receptor pad configuration, there is a utilization of a solder mask constituted of an insulating material, and which incorporates specifically sized and shaped solder openings or windows wherein, in a particular instance, the C4 receptor pad is essentially at the intersection of a copper trace and the solder mask window. Pursuant to a particular aspect, the solder mask opening is of a polygonal configuration, whereas in other instances, as described hereinbelow, the C4 receptor pad design may be essentially of a socalled "band aid" or circular configuration in which a circular pad is located below and within a round solder mask opening or window. The circular pad extends within and beyond the solder mask window or opening through the intermediary of the copper trace, thereby enabling the formation of equal solder areas on all pads and eliminating the previously encountered BLM floating problem leading to potentially unreliable connections and resulting chip failures.

6 Claims, 2 Drawing Sheets

RECEPTOR PAD STRUCTURE FOR CHIP CARRIERS

BACKGROUND OF THE INVENTION

The present invention relates to receptor pad structures for chip carriers, and in particular, non-floating BLM C-4 receptor pads for organic chip carriers preferably utilizing eutectic solder.

Basically, the chip carriers employ eutectic solder consisting of either a tin/lead plated solder, or it is adapted to be solder-injected or flip chip screen printed on the chip carrier C4 (controlled collapsed chip connect) receptor pads. In essence, the eutectic solder facilitates the use of existing C4 technology in conjunction with organic chip carriers, and wherein C4 bumps consists of Ball Limiting Metallurgy (BLM) chrome and chrome copper phased and evaporated 3.5% by weight of tin and 96.5% by weight of lead. In order to be able to produce solder joints between the eutectic solder on the chip carrier and the C4 bump, it is ordinarily the practice to deposit a controlled amount of eutectic solder on the C4 receptor pad. Basically, this amount of solder deposition is empirically determined and is predicated on various parameters including: chip size and the number of C4 bumps; the chip pitch; the C4 ball diameter; the C4 receptor pad area (normally determined by the copper trace width of the circuit lines and solder mask opening); and, finally, the encountered organic chip carrier warpage, which may be predicated on temperature differentials between the chip carrier surfaces. Ordinarily, each one of these of parameters, in turn, is derived through a set of specified secondary parameters, and upon all of the parameters being optimized, the eutectic solder is deposited on the organic chip carrier so as to form high reliable solder joints. In contrast therewith, when the above-referenced parameters are not properly optimized, the eutectic solder creeps up to the BLM (i.e. the C4 bump) and detaches the latter from the chip. Upon this occurrence, the solder joint will fail to maintain or lose its reliability, and the system will fail.

Currently, organic chip carrier C4 receptor pads create floating BLM which, occasionally, even in the instances of deposition of equal amounts of solder on various pads configurations, result in the obtaining of various or differing bump heights. Thus, the solder volume distributes itself over the pad area, and inasmuch as the pad areas are frequently of different sizes and shapes, this results in the creation of unequal bump heights. Consequently, even though the solder bumps are flattened prior to the placement of the chips on the printed circuit board, the tall bumps will rise faster which creates chip skewing or tilting, thereby adversely affecting the integrity and functional reliability of the formed solder joints. Moreover, as the chip settles into the molten solder during solder reflow, the tall bump solder will creep around the C4 bump and can easily reach the BLM, resulting in the adversely influencing BLM floating. Current technology utilizing the openings or windows of various insulating material masks with regard to the formation of solder joints have failed to solve the above encountered problem in ensuring the reliability of the solder joints. In essence, the current state-of-the-technology, has not been found an effective or fully satisfactory method of obviating the problems encountered in attempting to provide uniform and controlled formations of solder joints with regard to receptor pad structures.

DISCUSSION OF THE PRIOR ART

Machuga, et al., U.S. Pat. No. 5,523,920 discloses a printed circuit board including elevated bond or receptor pads, and wherein a mask constituted of an insulating material includes a mask opening or window which only exposes areas not encompassing the runner sections of circuit traces on a printed circuit board arranged below the mask. Moreover, the bond pads which are integrally formed with the runner sections at the opening include an upper surface having a lip overlying the insulating material mask. This will not enable the desired equalization of the deposition and distribution of solder on the receptor or bond pads.

Carey, et al., U.S. Pat. No. 5,075,965 discloses a controlled collapse chip connect (C4) method of joining an integrated circuit board to a microelectronic circuit card. There is no disclosure of providing a window or opening in an insulating material mask in a manner analogous to that described in the present invention for controlling the deposition and distribution of solder on receptor pads.

Barrow, U.S. Pat. No. 5,706,178 discloses a plurality of elliptically-shaped solder pads on the surface of a package substrate, wherein the pads are covered to a specific surface extent by a solder mask, and only portions of the pads are exposed through mask openings or windows which are essentially circular in nature. That type of masking structure does not facilitate the controlled deposition and distribution of eutectic solder on a receptor pad arrangement analogous to that contemplated by the present invention.

Fujita, et al., U.S. Pat. No. 4,336,551 discloses a thick-film printed circuit board, and wherein the wiring conductors include connecting sections for connection to solder electrodes of a semiconductor chip. In that particular instance, the holes formed in the pads will cause self-centering of the solder balls, and wherein each pad is located on top of the solder mask. This has nothing in common with the inventive concept and the solution to the above-mention problem encountered in the formation of reliable solder joints.

SUMMARY OF THE INVENTION

Accordingly, in order to solve the problem encountered in the prior art with regard to satisfactorily depositing solder, such as eutectic solder, on the receptor pads of chip carriers, particularly in providing equal distributions of the solder so that all pad areas are equalized irrespective as the type and size of receptor pad configuration, the present invention sets forth the novel utilization of a solder mask constituted of an insulating material, and which incorporates specifically sized and shaped solder openings or windows wherein, in a particular instance, the C4 receptor pad is essentially at the intersection of a copper trace and the solder mask window. Pursuant to a particular aspect, the solder mask opening is of a polygonal configuration, whereas in other instances, as described hereinbelow, the C4 receptor pad design may be essentially of a socalled "band aid" or circular configuration in which a circular pad is located below and within a round solder mask opening or window. The circular pad extends within and beyond the solder mask window or opening through the intermediary of the copper trace, thereby enabling the formation of equal solder areas on all pads and eliminating the previously encountered BLM floating problem leading to potentially unreliable connections and resulting chip failures.

Accordingly, it is an object of the present invention to provide a receptor pad design which equalizes all pad areas in the uniform deposition and distribution of solder.

Another object of the present invention resides in the provision of a solder mask incorporating an opening of generally polygonal shape in which the receptor pad is created by the intersection of a copper trace and solder mask.

Still another object of the invention is to provide for the utilization of a solder mask wherein a circular pad is located within a round solder mask opening or window, and in which the circular pad is extended within and beyond the window by the copper trace of a circuit line.

BRIEF DESCRIPTION OF THE DRAWINGS

Reference may now be had to the following detailed description of preferred embodiments of the invention, taken in conjunction with the accompanying drawings; in which.

DETAILED DESCRIPTION OF PREFERRED EMBODIMENTS

Figure 1:
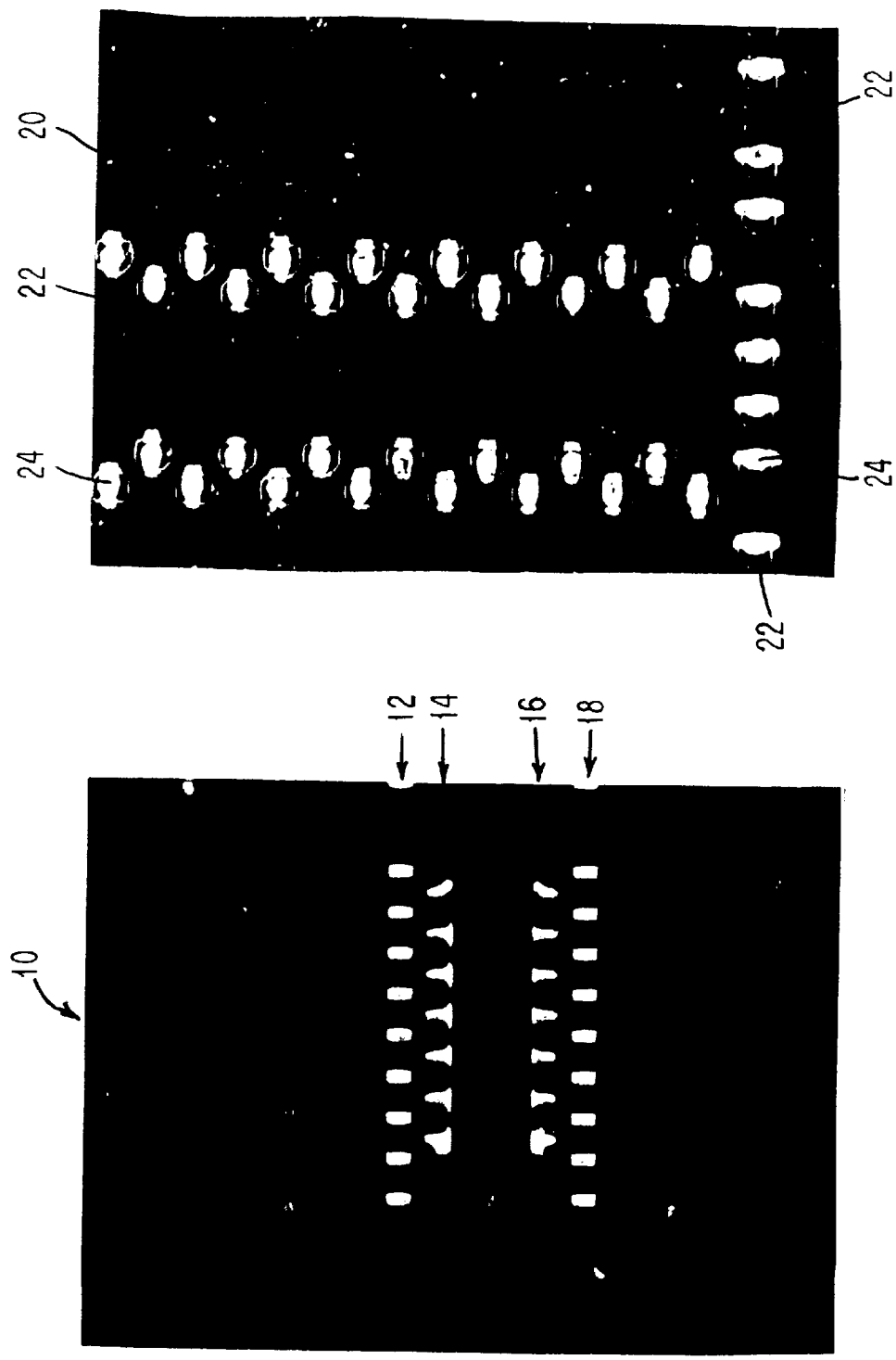
FIG. 1 illustrates a plan view showing three different types of C4 receptor pads representative of the problems encountered in the deposition of equal amounts of solder.

Referring to FIG. 1 of the drawings, there is illustrated a current C4 receptor pad configuration 10 which creates floating BLM (Ball Limiting Metallurgy) solder bumps. In essence, FIG. 1 illustrates different kinds of C4 receptor pads, three 12, 14 and 16 being employed for a power area and one 18 for a signal area. In all four types of receptor pads 12, 14, 16, 18, these are different in the sense that pursuant to the previously employed C4 bump solder deposition methods, these are intended to deliver equal volumes of solder to all C4 receptor pads. As can be ascertained from FIG. 1 of the drawing, in the event of deposition of equal amounts of solder on all four pad designs as illustrated, there are encountered different bump heights. The solder volume distributes itself over the respective pad area, and inasmuch as the areas are all different in both size and shape, this creates uneven bump heights. As a result, the following problems are encountered:

Even though the bumps are flattened prior to placing the chip on the chip carrier, the tall bumps will rise faster, resulting in chip skewing or chip tilting, thereby adversely affecting solder joint formations.

Furthermore, as the chip settles into the molten solder during solder reflow, the tall bump solder will tend to creep around the C4 bump and can easily reach the BLM, thereby resulting in the BLM floating, with all of the attendant difficulties in maintaining the reliability of the solder joint.

Figure 2:
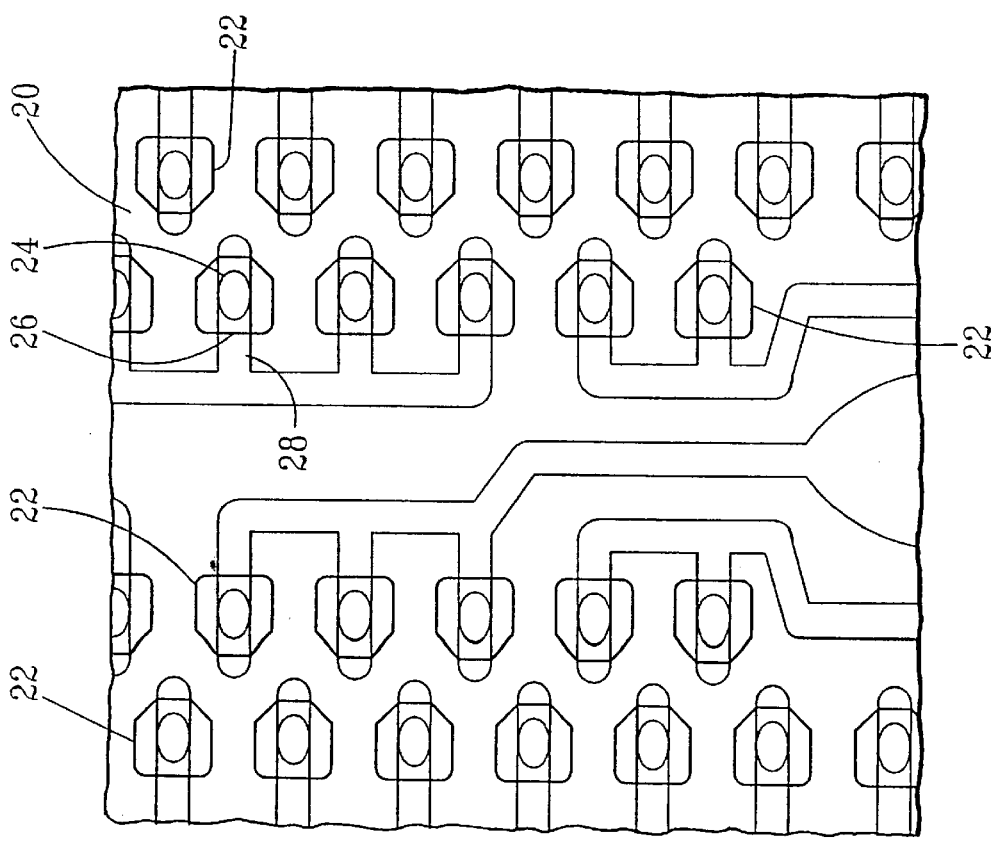
FIG. 2 illustrates an alternative arrangement in providing a non-floating C4 receptor pad configuration which equalizes all the pad areas for solder deposition in accordance with the invention.

As illustrated, pursuant to the invention, and referring to FIG. 2 of the drawings, pursuant to a specific embodiment, the latter discloses a solder mask 20 of an insulating material having polygonally-shaped solder mask openings or windows 22 formed therein, and wherein the C4 receptor pad 24 is created by the intersection 26 of copper traces 28 and the solder mask 20. This will provide for equal solder deposition areas on all pads and eliminate the BLM floating problems as has been previously encountered.

Figure 3:
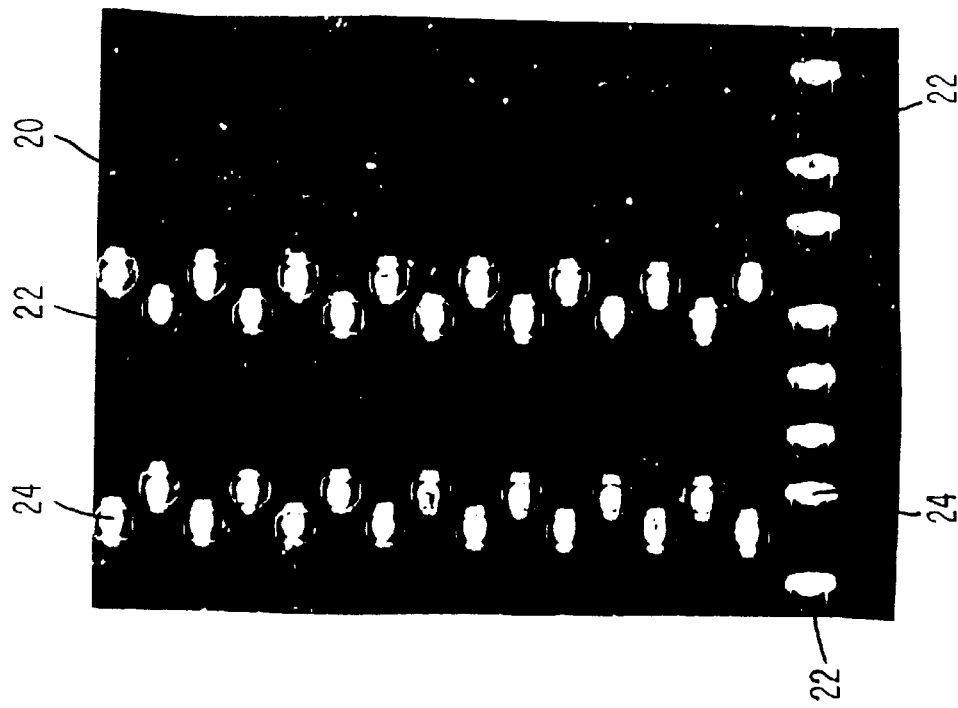
FIG. 3 illustrates, generally diagrammatically, similar to FIG. 1, the novel construction of the receptor pad and solder mask.

Referring to FIG. 3 of the drawings, this illustrates the actual product formed by the provision of the polygonally shaped solder mask openings or windows 22 of FIG. 2, clearly indicative of the uniform and equal distribution of solder, thereby eliminating the floating BLM problem encountered in the prior art and as practiced in the current-state-of-the-technology.

Figure 4:
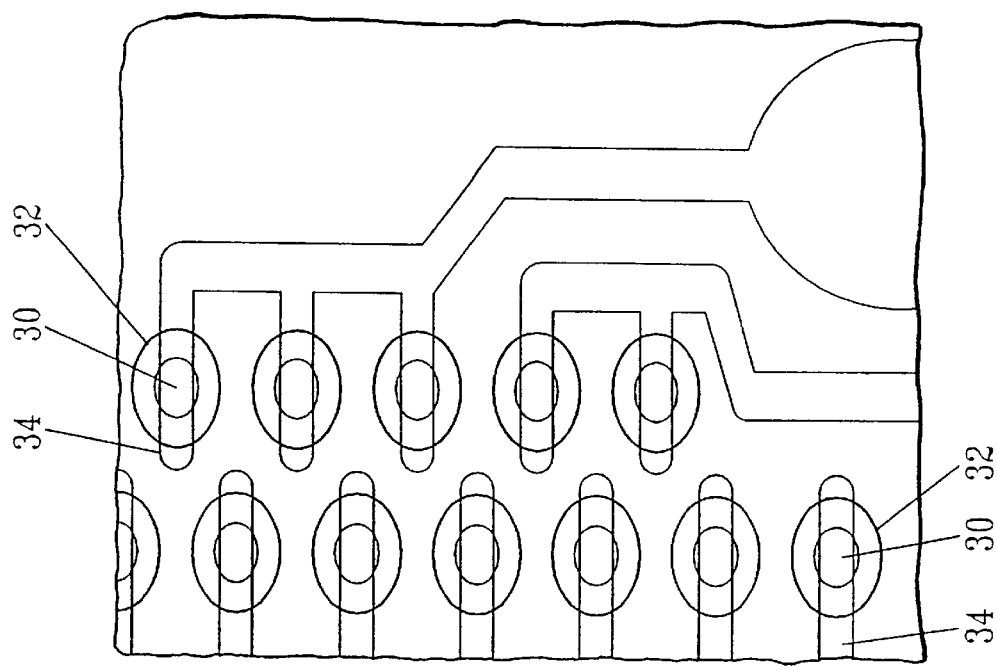
FIG. 4 illustrates a modified embodiment of the inventive non-floating C4 receptor pad design.

Reverting to FIG. 4 of the drawings, which illustrates a second embodiment of the invention, and by means of which there is solved the similar problems of BLM floating, this discloses a so-called "band aid" C4 receptor pad configuration 30. In essence, the each pad 30 possesses a circular pad shape which is arranged within the confines of a larger-sized round solder mask opening or window 32, with the circular pad 30 being extended within the solder mask window 32 and therebeyond by means of the copper trace 34 which is connected thereto.

The foregoing particular solder mask window configurations, and possibly other shapes, ensure the provision of equal areas on all pads, thus upon the deposition of eutectic solder avoiding and eliminating the adverse BLM floating situation which have been heretofore encountered.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A receptor pad structure for chip carriers; comprising, in combination:
    (a) a substrate having a plurality of receptor sites each comprising a controlled collapse chip connector locale defining a specific perimeter, said substrate including a surface with said receptor sites being located on said surface;
    (b) a circuitized conductive layer being arranged on said substrate surface, conductive lines of said circuit crossing the perimeters of said receptor sites, each of said conductive lines including a bulge pattern located approximately centered at respectively said receptor sites; and
    (c) a solder mask of an insulating material on said substrate surface substantially covering said conductive layer, said receptor sites being each formed by an intersection of a copper trace of said conductive circuit line and the solder mask, openings formed in said solder mask which are larger in area than said bulge patterns, each of said openings being approximately centered over the center of each of said receptor sites; said openings in said solder mask being of selectively varying shapes so as to facilitate the formation of substantially equal solder areas on all of the receptor sites.

2. A receptor pad structure as claimed in claim 1, wherein said solder mask opening at each said receptor site has a generally polygonal configuration.

3. A receptor pad structure as claimed in claim 1, wherein each said receptor site is of a substantially circular configuration, and each said solder mask opening is essentially round and extends about the therewith associated circular receptor site.

4. A receptor pad structure as claimed in claim 3, wherein each said circular receptor site is extended within and beyond said mask opening by a copper trace of said circuit line.

5. A receptor pad structure as claimed in claim 1, wherein said substrate comprises an organic chip carrier.

6. A receptor pad structure as claimed in claim 5, wherein eutectic solder is utilized on said organic chip carrier to form solder joints at said sites, said mask openings facilitating a uniform distribution of solder at each said receptor site.

* * * * *